(12) United States Patent
Aikawa et al.

(10) Patent No.: US 11,397,443 B2
(45) Date of Patent: Jul. 26, 2022

(54) FLUID CONTROL DEVICE AND SEMICONDUCTOR MANUFACTURING APPARATUS

(71) Applicant: FUJIKIN INCORPORATED, Osaka (JP)

(72) Inventors: Kenji Aikawa, Osaka (JP); Takahiro Matsuda, Osaka (JP); Toshiyuki Inada, Osaka (JP); Kazunari Watanabe, Osaka (JP); Yuta Motegi, Osaka (JP); Tomohiro Nakata, Osaka (JP); Tsutomu Shinohara, Osaka (JP)

(73) Assignee: FUJIKIN INCORPORATED, Osaka (JP)

(*) Notice: Subject to any disclaimer, the term of this patent is extended or adjusted under 35 U.S.C. 154(b) by 0 days.

(21) Appl. No.: 17/038,459

(22) Filed: Sep. 30, 2020

(65) Prior Publication Data

US 2021/0132638 A1 May 6, 2021

(30) Foreign Application Priority Data

Oct. 31, 2019 (JP) .............................. JP2019-198284

(51) Int. Cl.
*H01L 21/67* (2006.01)
*F16K 27/00* (2006.01)
(Continued)

(52) U.S. Cl.
CPC ......... *G05D 7/0664* (2013.01); *F16K 27/003* (2013.01); *F16K 31/50* (2013.01); *H01L 21/6715* (2013.01)

(58) Field of Classification Search
CPC ................... F16K 27/003; F16K 31/05; Y10T 137/87885; H01L 21/6715; G05D 7/0664
See application file for complete search history.

(56) References Cited

U.S. PATENT DOCUMENTS 3,486,519 A * 12/1969 Olson ................. F15B 13/0825
137/884
9,850,920 B2 * 12/2017 Inada .................. F15B 13/0814
(Continued)

FOREIGN PATENT DOCUMENTS

| JP | 2002-206700 | 7/2002 |
| JP | 2007-3013 | 1/2007 |
| JP | 2019152218 A | 9/2019 |

OTHER PUBLICATIONS

Machine translation of JP2002206700A (Year: 2002).*
Korean Office Action in counterpart Korean Application No. 10-2020-0140224, dated Oct. 20, 2021.

*Primary Examiner* — Michael R Reid
(74) *Attorney, Agent, or Firm* — Greenblum & Bernstein, P.L.C.

(57) ABSTRACT

A fluid control device includes a first block row and a second block row each including a plurality of joint blocks having a width of the standard size and arranged along a first directions, the first block row and the second block row being arranged at predetermined intervals in the second directions perpendicular to the first directions, wherein each of the plurality of joint blocks constituting the first block row has a large diameter flow path for forming a single line, and each of the plurality of joint blocks constituting the second block row has a smaller diameter flow path than the large diameter flow path for forming the first line and the second line.

13 Claims, 6 Drawing Sheets

(51) Int. Cl.
*G05D 7/06* (2006.01)
*F16K 31/50* (2006.01)

(56) References Cited

U.S. PATENT DOCUMENTS

2007/0289652 A1* 12/2007 Curran .................... F16L 47/03
137/884
2019/0271402 A1* 9/2019 Doya ....................... F16K 27/00

* cited by examiner

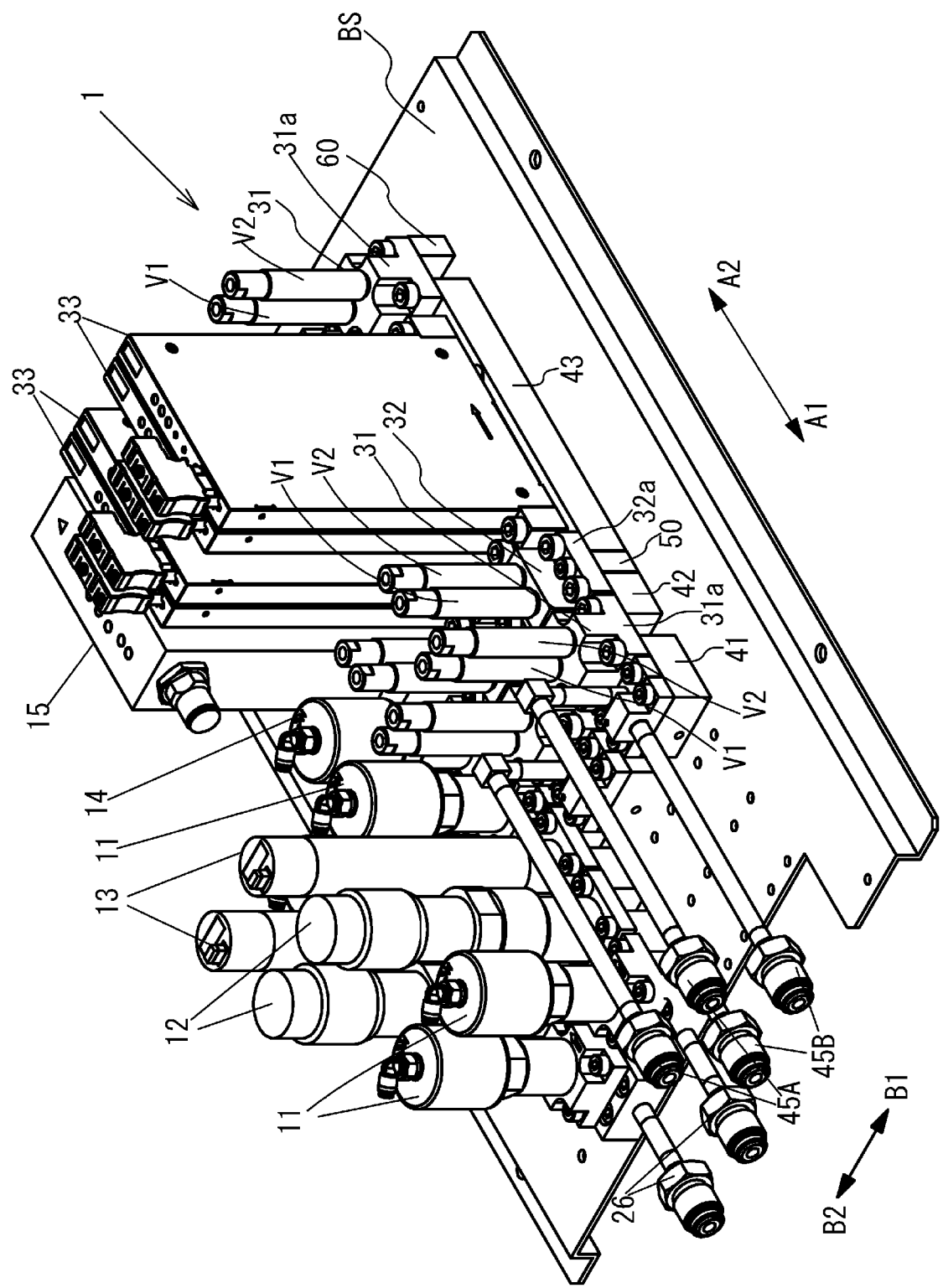
F I G.1

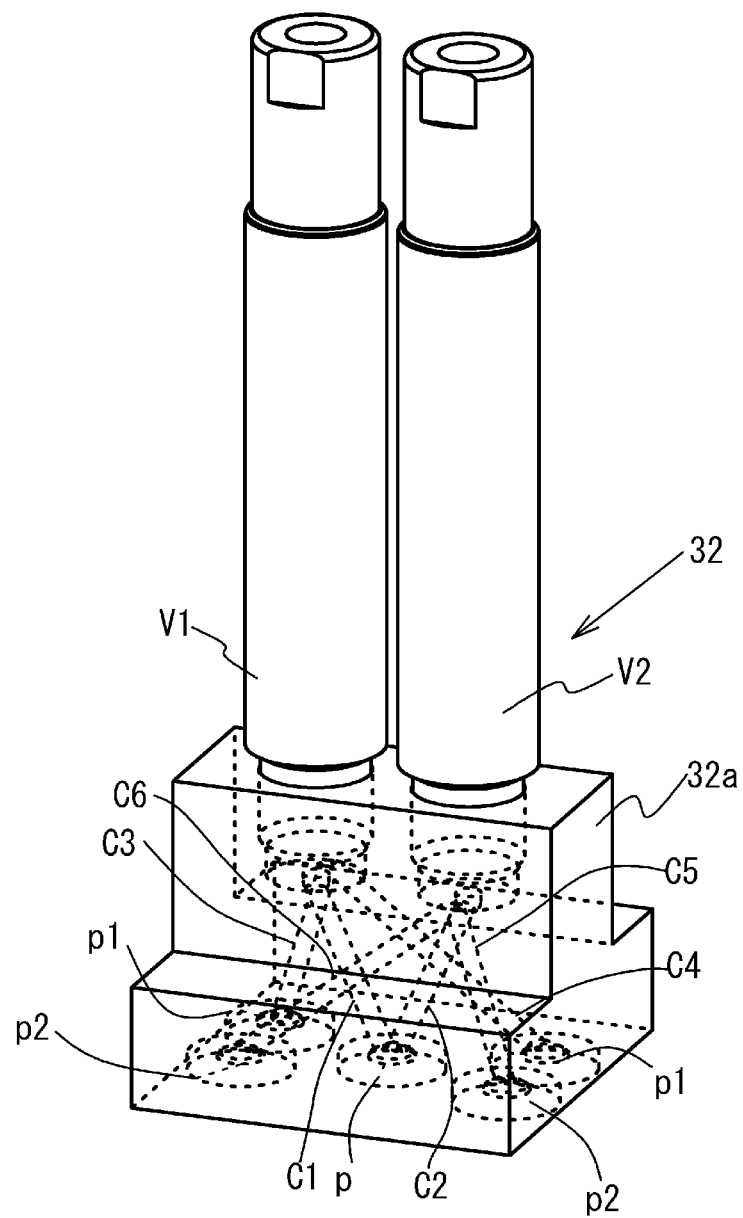
F I G. 5

FLUID CONTROL DEVICE AND SEMICONDUCTOR MANUFACTURING APPARATUS

CROSS-REFERENCE TO RELATED APPLICATIONS

This application is based upon and claims the benefit of priority from the Japanese Patent Application No. 2019-198284, filed Oct. 31, 2019 the entire content of which is incorporated herein by reference.

The present invention relates to a fluid control device and a semiconductor manufacturing apparatus using the same.

TECHNICAL FIELD

Background Art

As a fluid control device that is used to supply various process gases to e.g. a chamber of a semiconductor manufacturing apparatus, a fluid control device in which a plurality of fluid device are arranged from upstream to downstream is widely used (for example, see Patent Literature 1).

In the field of fluid control device as described above, high-responsiveness is required for supply control of process gases. For this reason, it is necessary to downsize and integrate the fluid control device as much as possible and install the fluid control device closer to the chamber where the fluid is supplied. For this reason, a fluid control device with a width of 10 mm, which is smaller and more integrated than the currently manufactured fluid control devices with a width of 1.125 inches (about 29 mm), has been developed.

PATENT LITERATURE

PTL 1: Japanese Laid-Open Patent Application No. 2002-206700
PTL 2: Japanese Laid-Open Patent Application No. 2007-3013

SUMMARY OF INVENTION

Technical Problem

The fluid control device with a width of 10 mm is advantageous in terms of downsizing and integration as compared with the fluid control device with a width of 1.125 inches. However, a fluid control device with a width of 10 mm has a smaller diameter of the flow path than a fluid control device with a width of 1.125 inchs, making it difficult to secure a fluid-supply flow rate.

That is, along with increase in the size of materials to be processed such as increase in the diameter of semiconductor wafers, the supply flow rate of the fluid supplied from the fluid control device to the chamber also needs to be increased or maintained.

An object of the present invention is to provide a fluid control device capable of ensuring a supply flow rate while realizing downsizing and integration.

Solution to Problem

The fluid control device of the present invention is a fluid control device comprising a first block row and a second block row each including a plurality of joint blocks having a width of standard size and arranged along a first direction, the first block row and the second block row being arranged at predetermined intervals in a second direction perpendicular to the first direction, wherein each of the plurality of joint blocks constituting the first block row has a large-diameter flow path for forming a single line, and each of the plurality of joint blocks constituting the second block row has small-diameter flow paths having a smaller diameter than the large-diameter flow path, for forming a first line and a second line.

The fluid control device of the present invention may further comprise a fluid device installed on the first block row, having the large-diameter flow path connected to the single line, and having a dimension of the standard size, and a fluid device installed on the second block row, connected to the first line or the second line and having a width equal to or less than a half the width of the standard-size.

Preferably, the fluid device comprises a first fluid device and a second fluid device arranged in parallel in a common joint block.

In this case, a configuration can be employed in which the fluid device includes a flow control device.

A configuration may be employed in which the fluid control device further comprises a fluid device installed on adjacent joint blocks of the second block row, connected to the first and second lines, and having a body having a width of the standard size.

A configuration may be employed in which the fluid device includes a two-way valve having two valve elements arranged in parallel, and the two-way valve has a valve body common to the two valve elements and having a width of the standard size.

Preferably, the body of the two-way valve is air-tightly or liquid-tightly fastened to each of the adjacent joint blocks by two bolts.

It further comprises a manifold extending in the second direction and having a common flow path connected to the single line and to the first and second lines.

A configuration may be employed in which the manifold has a port for the large diameter flow path and a port for the small diameter flow path formed so as to communicate with the common flow path.

Alternatively, a configuration may be employed in which the manifold has the ports for the large diameter flow paths formed at equal intervals, one port for the large diameter flow paths is connected to the single line of the first block row via a fluid device, and another port is connected to the first line and the second line of the second block row via a valve device.

Preferably, a configuration may be employed in which the valve device has two valve elements and a valve body common for the two valve elements, the valve body has first to fifth ports on a bottom surface, the first port is connected to the port for the large-diameter flow path of the manifold, and the second to fifth ports, respectively connected to the first line or second line constituted by the small-diameter flow paths of adjacent joint blocks of the second block row.

More preferably, a configuration may be employed in which the valve body of valve device is air-tightly or liquid-tightly fastened to each of the adjacent joint blocks by two bolts, and air-tightly or liquid-tightly fastened to the manifold by two bolts, and the diameters of two bolts fastening the valve body to the adjacent joint blocks differ from the diameters of two bolts fastening the valve body to the manifold.

Preferably, a configuration may be employed in which the joint block included in the first block row has screw holes for fastening a fluid device, formed on both sides respectively in the width direction of each port formed on the surface, the joint block included in the second block row has a single screw hole for fastening a fluid device, formed adjacent to each port formed on the surface.

Advantageous Effects of Invention

According to the present invention, there is provided a fluid control device capable of realizing downsizing and integration while ensuring a supply flow rate.

BRIEF DESCRIPTION OF DRAWINGS

FIG. 1 is an external perspective view of a fluid control device according to an embodiment of the present invention.

FIG. 5 is a perspective view of a valve device.

DESCRIPTION OF EMBODIMENTS

Figure 2:
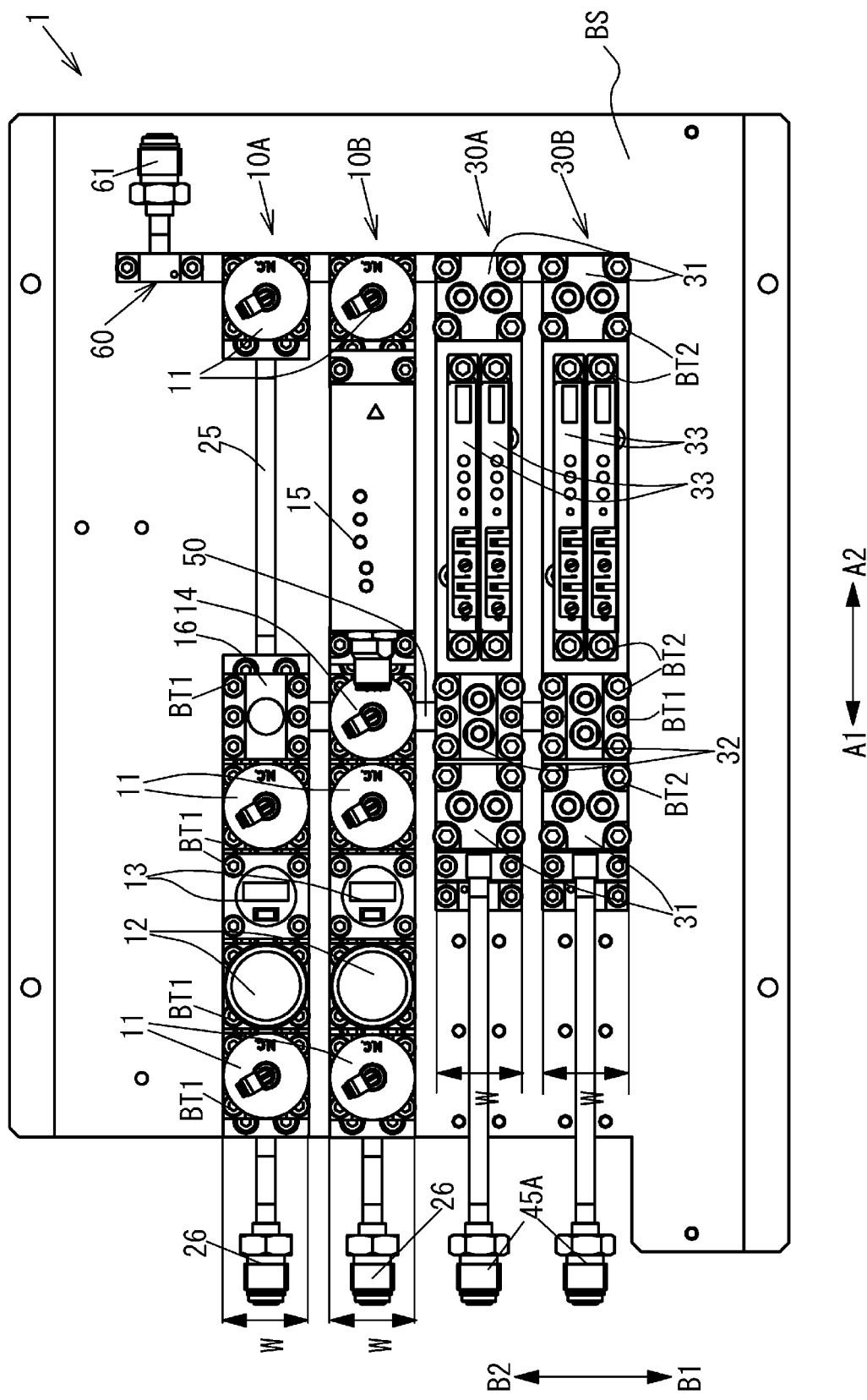
FIG. 2 is a plan view of the fluid control device of FIG. 1.

Embodiments of the present invention will be described below with reference to the drawings. In the present specification and the drawings, the same reference numerals are used to denote components having substantially the same functions, and thus a repetitive description thereof is omitted. In the drawing, A1 and A2 indicate the longitudinal directions, A1 indicates the upstream side, A2 indicates the downstream side, B1 and B2 indicate the width directions, B1 indicates the front side, and B2 indicates the rear side.

Figure 3:
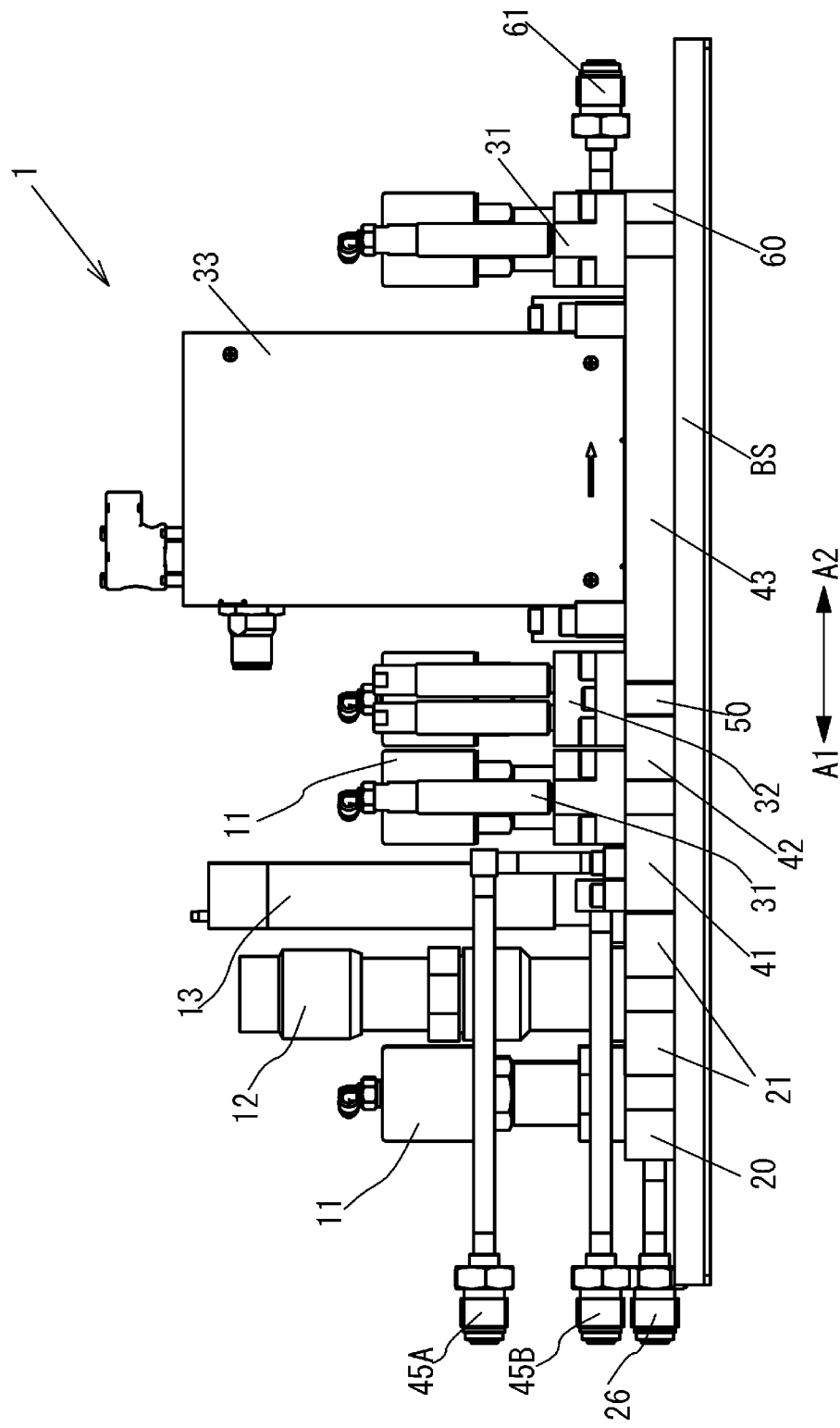
FIG. 3 is a front view of the fluid control device of FIG. 1.

The fluid control device 1 shown in FIGS. 1 to 3 has fluid device rows 10A, 10B, 30A, 30B each comprising a plurality of fluid device arranged along the longitudinal direction A1, A2 on the sheet metal plate BS. The fluid device rows 10A, 10B, 30A, 30B are arranged at equal intervals in the widthwise B1, B2.

The "fluid device" of the present invention is a device used in a fluid control device that controls the flow of fluid, and is provided with a body that defines a fluid flow path, and has at least two ports open at the surfaces (bottom surface) of the body.

Figure 4:
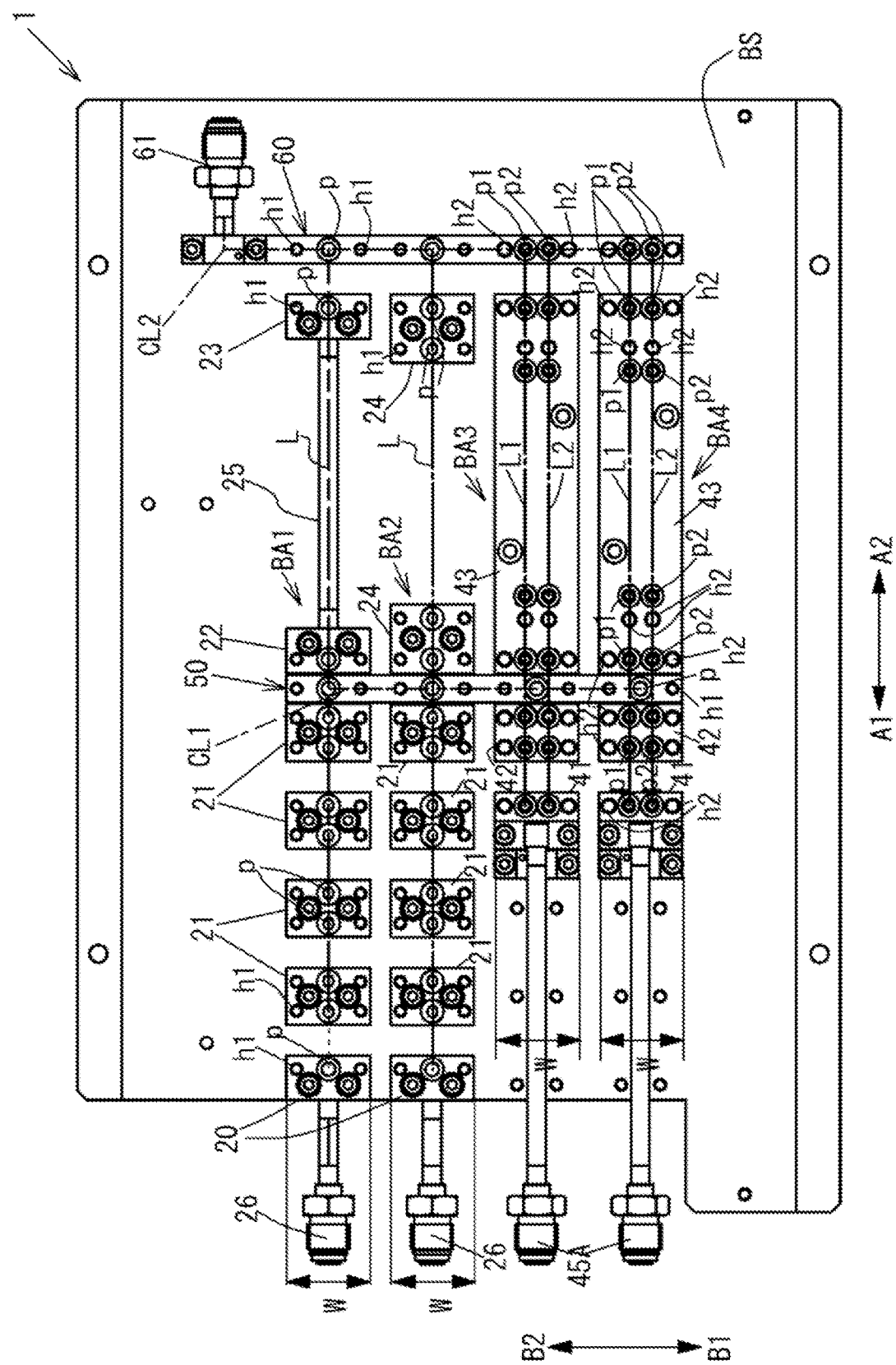
FIG. 4 is a plan view showing the fluid control device of FIG. 2 from which the fluid devices are removed.
Figure 6:
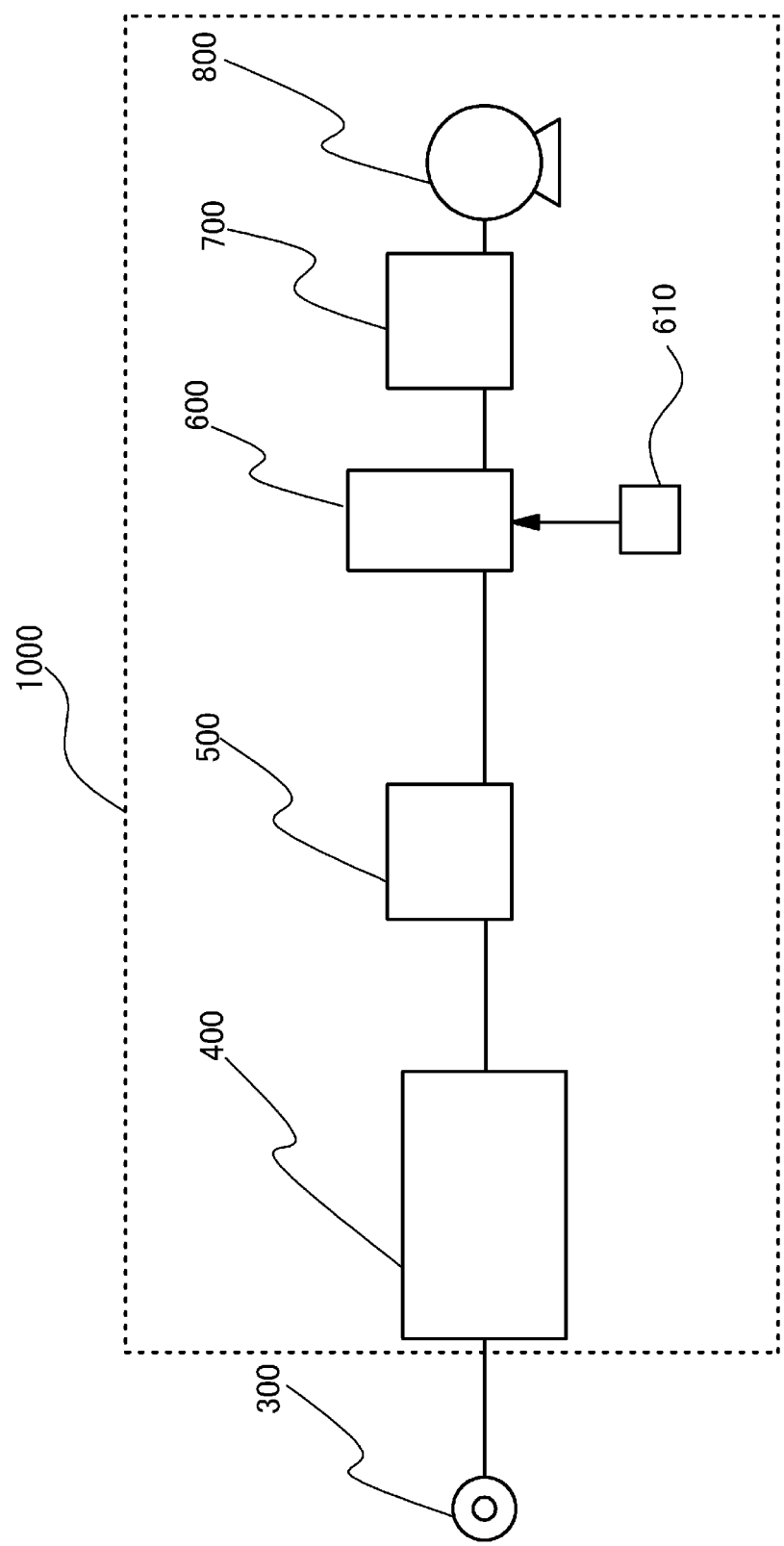
FIG. 6 is a schematic configuration diagram of a semiconductor manufacturing apparatus.

Here, FIG. 4 shows joint block rows BA1 to BA4 on which the above fluid device rows 10A, 10B, 30A, 30B are to be installed.

The joint block row BA1 consists of a joint block 20, four joint blocks 21, a joint block 22 and a joint block 23.

The joint block row BA2 consists of a joint block 20, four joint blocks 21, and two joint blocks 24.

The joint blocks included in the joint block rows BA1 and BA2 have the standard size specified in F82-F95 of SEMI (Semiconductor Equipment and Materials International) and the width W is 1.125 inches.

Joint block 20 has a flow path (not shown) formed therein, one end of the flow path is connected to the introduction pipe 26 at the upstream end face, and the other end of the flow path is open as a port p at the upper surface.

Joint block 21 has a V-shaped flow path (not shown) formed therein, the ends of the flow path are open as two ports p at the upper surface.

Joint block 22 has a flow path (not shown) formed therein, one end of the flow path is a protruding pipe protruding from the downstream end face, which is connected to the pipe 25 by welding or the like, the other end of the flow path is open as a port p at upper surface.

Joint block 23 has a flow path (not shown) formed therein, one end of the flow path is a protruding pipe protruding from the upstream end face, which is connected to the pipe 25 by welding or the like, the other end of the flow path is open as a port p at upper surface.

Joint block 24 has a V-shaped flow path (not shown) formed therein, the ends of the flow path are open as two ports p at upper surface.

The ports p of the joint blocks 21 to 24 have dimensions defined in F82-F95 of SEMI, and are connected to ports formed on bottom surfaces of the bodies of the fluid devices through sealing members (not shown) such as metallic or plastic gaskets. The fastening of the fluid device bodies to the joint blocks are achieved by screwing the M4 bolts BT1 (FIG. 2) with screw holes h1 formed in the joint blocks 21-24. Screw holes h1 are provided on both sides of each port p in the widthwise directions B1 and B2.

When the fluid devices are installed on the joint block rows BA1, BA2, respective single lines L through which fluid flows are formed.

Joint block rows BA3, BA4 have the same configuration, consisting of a joint block 41, a joint block 42 and a joint block 43.

Joint blocks 41 to 43 are formed with flow paths for forming a first line L1 and a second line L2. The width W of joint blocks 41 to 43 is 1.125 inches. The diameter of the flow path formed in the joint blocks 41 to 43 is about 2.5 to 3 mm, the diameter of the flow path formed in the joint blocks 21 to 24 included in the joint block row BA1, BA2 is about 4 to 5 mm. In other words, large-diameter flow paths are formed in the joint blocks 21 to 24, and small-diameter flow paths are formed in the joint blocks 41 to 43.

The joint block 41 is formed with flow paths that are respectively connected to the two introduction pipes 45A, 45B, and the ends of the two flow paths are opened as ports p1 and port p2 at the upper surface, respectively.

Joint block 42 has two V-shaped flow path (not shown) formed therein, both ends of one flow path are open as two ports p1 at upper surface, and both ends of the other flow path are open as two ports p2 at upper surface.

The joint block 43 is formed with four ports p1 and four ports p2. Two ports p1 on the upstream side communicate with each other through a flow path formed inside, and two ports p1 on the downstream side communicate with each other through a flow path formed inside. Two ports p2 on the upstream side communicate with each other through a flow path formed inside, and two ports p2 on the downstream side communicate with each other through a flow path formed inside.

The above-mentioned ports p are ports connected to a line L that is a large diameter flow path, the ports p1 are ports connected to a first line L1 that is a small diameter flow path, and the ports p2 are ports connected to a second line L2 that is a small diameter flow path.

A single screw hole h2 is formed next to each of the ports p1 and p2. The screw hole h2 has a larger diameter than the screw hole h1 described above, and is, for example, M5.

Each of the ports p1 and p2 is connected to a port formed on the bottom surface of the body of fluid device through sealing members (not shown) made of metallic or resinous gaskets. To fasten the body of the fluid device to each joint block, the bolt BT2 (FIG. 2) of M5 is screwed into the screw hole h2 formed in each joint block 41 to 43.

When the fluid devices are installed on the joint block rows BA3 and BA4, the first line L1 and the second line L2 in which the fluid flows are formed, respectively.

As shown in FIG. 4, a manifold 50 is arranged in a direction perpendicular to the joint block rows BA1 to BA4, that is, in the width directions B1, B2, and a common flow path CL1 is formed therein. Ports p are formed at equal intervals so as to communicate with the common flow path CL1. Screw holes h1 of M4 are formed on both sides of each port p.

As shown in FIG. 4, a manifold 60 is arranged in the width direction B1, B2, and is arranged on the most downstream side of the longitudinal direction A1, A2, and a common flow path CL2 is formed therein. Ports p are formed at positions corresponding to the lines L and ports p1 and ports p2 are formed in parallel at positions corresponding to the first lines L1 and the second lines L2 so as to communicate with the common flow path CL2. Screw holes h1 of M4 are formed on both sides of each ports p, and a single screw hole h2 of M5 is formed adjacently to each port p1 and each port p2. Further, a lead-out pipe 61 is connected to one end of the manifold 60.

In the present embodiment, the manifolds 50 and 60 are formed in a block shape and are a kind of joint block.

As shown in FIGS. 1 to 3, the fluid device row 10A has fluid devices arranged from the upstream side to the downstream side in the order of an automatic valve (two-way valve) 11, a regulator 12, a pressure gauge 13, an automatic valve (two-way valve) 11, a joint 16, and an automatic valve (two-way valve) 11. The joint 16 serves to communicate the respective ports p of the joint block 21, the manifold 50 and the joint block 22 with each other, so that the common flow path CL1 of the manifold 50 is always connected to the line L.

The fluid device row 10B has fluid devices arranged from the upstream side to the downstream side in the order of an automatic valve (two-way valve) 11, a regulator 12, a pressure gauge 13, an automatic valve (two-way valve) 11, an automatic valve (three-way valve) 14, a flow control device 15, and an automatic valve (two-way valve) 11.

The fluid devices included in the fluid device rows 10A and 10B have the standard size defined in SEMI F82F95, and are fastened to joint blocks with bolts BT1 of M4. The fluid devices included in the fluid device rows 10A and 10B include large-diameter flow paths forming the lines L.

The fluid device row 30A and the fluid device row 30B have the same configuration. In the fluid device row 30A, from the upstream side toward the downstream side, fluid devices are placed in the order of a two-way valve 31 which is an automatic valve, a valve device 32 which is an automatic valve, two flow control devices 33, and a two-way valve 31 which is an automatic valve. The fluid devices constituting the fluid device row 30A and the fluid device row 30B each has a small diameter flow path constituting the first line L1 or the second line L2.

One of the two-way valves 31 is installed on the joint block 41 and the joint block 42, the other is installed on the joint block 43 and the manifold 60. In the two-way valve 31, two valve elements V1, V2 each having a built-in actuator are arranged in parallel in the width directions B1, B2, and these two valve elements V1, V2 are provided on the valve body 31a having a width W of the standard size. Although not shown, the valve body 31a has two ports p1 on the bottom surface and a flow path communicating between the ports p1 via the valve element V1, and has two ports p2 and a flow path communicating between the ports p2 via the valve element V2, and the valve body 31a is air-tightly or liquid-tightly fastened to the respective joint blocks by tow bolts BT2 of M5. The valve element V1 opens and closes the first line L1, and the valve element V2 opens and closes the second line L2.

The valve device 32 is installed on the joint block 42, the manifold 50 and the joint block 43. The valve device 32 is provided for circulating a purging gas supplied through the manifold 50.

FIG. 5 shows the configuration of the valve device 32.

The valve device 32 is provided with two valve elements V1, V2 and a valve body 32a on which the two valve elements V1, V2 are commonly provided. In the valve body 32a, five ports are formed on the bottom surface, one of the five ports is a port p to be connected to the port p of the manifold 50, two ports p1 are to be connected to the first line L1, and the other two ports p2 are to be connected to the second line L2.

In the valve body 32a, flow paths C1 to C6 are formed, and one ends of flow paths C1 and C2 communicate with a common port p, and one ends of flow paths C3 and C4 communicate with one port p1 and the other port p1, and one ends of flow paths C5 and C6 communicate with one port p2 and the other port p2. Flow paths C3, C4 has the other ends communicating with each other in the valve chamber of the valve element V1, and flow path C5, C6 has other ends communicating with each other in the valve chamber of the valve element V2. Flow path C 1 is connected to the flow paths C3, C4 via a valve in the valve chamber of the valve element V1. Flow path C2 is connected to the flow paths C5, C6 via a valve in the valve chamber of the valve element V2.

By operating the valve elements V1, V2, the communication state between the common flow path CL1 of the manifold 50 and the first line L1 and the second line L2 is selectively changed.

The valve body 32a of valve device 32 is air-tightly or liquid-tightly fastened to the joint block 42 and the joint block 43 by two bolts BT2 of M5, respectively. The valve body 32a is air-tightly or liquid-tightly fastened to the manifold 50 by two bolts BT1 of M4.

The flow rate control devices 33 each has a width of 10 mm, and two such flow rate control devices 33 are arranged in parallel within upper surface of the joint block 43. The two flow rate control devices 33 are connected to the line L1 and the line L2 through the port p1 and the port p2, respectively. The body of each flow control device 33 is fastened to the joint block 43 in two M5 bolts BT2 at the upstream and downstream sides. Although not shown, the flow rate control device 33 includes a flow rate sensor unit that measures the mass flow rate of a fluid passing through the fluid flow path, an adjustment valve that adjusts the flow rate of the fluid passing through fluid flow path, and a control unit that controls the opening degree of the adjusting valve so that the mass flow rate of the fluid measured by the flow sensor unit becomes a predetermined value. The flow control device 15 is constructed in the same manner.

In the above fluid control device 1, there are provided the fluid device rows 10A, 10B each having a single line L formed in a large-diameter flow path, and the fluid device rows 30A, 30B having a first line L1 and a second line L2 formed of a small-diameter flow path, and the single line L and the first line L1 and the second line L2 are connected to each other by the manifold 50 or 60. As a result, the degree of integration of the fluid control device 1 can be increased while ensuring the supply flow rate of the fluid. A large flow rate of fluid can be supplied from the fluid device rows 10A, 10B, and a smaller but more precisely metered flow rate of fluid can be supplied from the fluid device rows 30A, 30B.

In the above embodiment, tow flow control devices 33 are installed in one joint block 43, but the construction is not limited thereto, and the number may be one. It is also possible to install the flow control device 33 in separate joint blocks In the above embodiment, the flow rate control devices 33 were installed on the joint block 43, but the construction is not limited thereto, and they may be installed on two joint blocks.

In the above embodiment, since the valve body 31a of the two-way valve 31 is shared by two valve elements, as compared with the case of forming the valve body for each valve element, the sealing performance between the valve body 31a and the joint block can be more stabilized.

In the above embodiment, since two flow rate control devices 33 are arranged in parallel within upper surface of the joint block 43 and fastened to the joint block 43 at two positions on the upstream and downstream sides, respectively, by bolts BT2, as compared with the case of installing them on two or more joint blocks, it is possible to more stabilize the sealing performance between the flow rate control devices 33 and the joint block.

In the above embodiment, since the manifold 50 having the ports p for the large-diameter flow path is installed between the joint blocks 42 and 43, for example, when it is desired to replace the joint block row BA1 with the joint block row BA3, it is possible to perform replacement and assembly of fluid devices etc. without removing the manifold 50 or other joint block row, and the workability can be improved.

Note that the present embodiment is not limited to the above-described examples. Those skilled in the art can make various additions, changes, and the like within the scope of the present disclosure.

Fluid device rows 10A, 10B, 30A, and 30B each including a plurality of fluid devices arranged along the longitudinal directions A1 and A2 are arranged in this order, but the present invention is not limited to this, and for example, the rows 10A, 30A, 10B, and 30B may be arranged in this order. At this time, the ports p, p1, and p2 of the manifold 60 may be opened at appropriate positions. Although the manifold 50 has four ports p formed at equal intervals, any number of ports p may be formed as long as two or more ports p are formed at equal intervals.

Next, the semiconductor manufacturing apparatus of the present invention will be explained.

Semiconductor manufacturing apparatus 1000 shown in FIG. 10 is an apparatus for performing a semiconductor manufacturing process according to the ALD method (Atomic Layer Deposition method), where 300 is a process gas supply source, 400 is a gas box, 500 is a tank, 600 is an open-close valve, 610 is a controller, 700 is a processing chamber, and 800 is an exhaust pump.

In the semiconductor manufacturing process by the ALD method, it is necessary to precisely adjust the flow rate of the process gas, and along with increase of the size of the substrate, it is also necessary to secure the flow rate of the process gas to some extent.

The gas box 400 houses the fluid control device 1 of the present embodiment in the box for supplying an accurately metered process gas to the processing chamber 700.

The tank 500 functions as a buffer for temporarily storing the process gas supplied from the gas box 400.

The open-close valve 600 controls the flow rate of the metered gas in the gas box 400.

The controller 610 executes the flow control by controlling the open-close valve 600.

The processing chamber 700 provides a sealed processing space for forming a film on a substrate by the ALD method.

The exhaust pump 800 evacuates the inside of the processing chamber 700.

In the above application example, the case where the flow rate control device of the present invention is used in the semiconductor manufacturing process by the ALD method has been exemplified, but the present invention is not limited to this, and the present invention can be applied to any object requiring precise flow rate control, such as an atomic layer etching (ALE: Atomic Layer Etching method).

REFERENCE SIGNS LIST

1: Fluid control device
10A, 10B: Fluid device row
11: Automatic valve
12: Regulator
13: Pressure gauge
14: Automatic valve
15: Flow control device
16: Joint
20 to 24: Joint block
25: Pipe
26: Introduction pipe
30A, 30B: Fluid device row
31: Two-way valve
31a: Valve body
32: Valve device
32a: Valve body
33: Flow control device
41, 42, 43: Joint block
45A, 45B: Introduction pipe
50, 60: Manifold
61: Lead-out pipe
400: Gas box
500: Tank
600: Open-close valve
610: Controller
700: Processing chamber
800: Exhaust pump
1000: Semiconductor manufacturing apparatus
A1, A2: Longitudinal direction
B1, B2: Width direction
BA1 - BA4 : Joint block row
BS : Sheet metal plate
BT1, BT2 : Bolt
C1 - C6: Flow path
CL1, CL2: Common flow path
L: Single line
L1: First line
L2: Second line
V1, V2: Valve element
h1, h2: Screw hole
p: Port
p1: Port
p2: Port

What is claimed is:

1. A fluid control device comprising a first block row and a second block row each including a plurality of joint blocks having a width of standard size and arranged along a first direction, the first block row and the second block row being arranged at predetermined intervals in a second direction perpendicular to the arrangement direction of the first direction, wherein each of the plurality of joint blocks constituting the first block row has a large-diameter flow path for forming a single line, and each of the plurality of joint blocks constituting the second block row having small-diameter flow paths has a smaller diameter than the large-diameter flow path, for forming a first line and a second line, the fluid control device further comprising a fluid device installed on the first block row, having the large-diameter flow path connected to the single line, and having a dimension of the standard size, and a fluid device installed on the second block row, connected to the first line or second line, and having a width less than a half the width of the standard size.

2. The fluid control device according to claim 1, wherein the fluid device comprises a first fluid device and a second fluid device connected to the first and second lines, respectively, and arranged in parallel in a common joint block.

3. The fluid control device according to claim 1, wherein each fluid device includes a flow control device.

4. The fluid control device according to claim 1, further comprising a fluid device installed on adjacent joint blocks of the second block row, connected to the first and second lines, and having a body having a width of the standard size.

5. The fluid control device according to claim 1, wherein the joint block included in the first block row has screw holes for fastening a fluid device, formed on both sides respectively in the widthwise direction of each port formed on the surface, the joint block included in the second block row has a single screw hole for fastening a fluid device, formed adjacent to each port formed on the surface.

6. A semiconductor manufacturing apparatus comprising the fluid control device as claimed in claim 1, used for controlling a process gas in a manufacturing process of a semiconductor device requiring a treatment process by the process gas in a sealed chamber.

7. A fluid control device comprising a first block row and a second block row each including a plurality of joint blocks having a width of standard size and arranged along a first direction, the first block row and the second block row being arranged at predetermined intervals in a second direction perpendicular to the arrangement direction of the first direction, wherein each of the plurality of joint blocks constituting the first block row has a large-diameter flow path for forming a single line, and each of the plurality of joint blocks constituting the second block row having small-diameter flow paths has a smaller diameter than the large-diameter flow path, for forming a first line and a second line, the fluid control device further comprising a fluid device installed on adjacent joint blocks of the second block row, connected to the first and second lines, and having a body having a width of the standard size, wherein the fluid device includes a two-way valve having two valve elements arranged in parallel, and the two-way valve has a valve body common to the two valve elements and having a width of the standard size.

8. The fluid control device according to claim 7, wherein the body of the two-way valve is air-tightly or liquid-tightly fastened to each of the adjacent joint blocks by two bolts.

9. A fluid control device comprising a first block row and a second block row each including a plurality of joint blocks having a width of standard size and arranged along a first direction, the first block row and the second block row being arranged at predetermined intervals in a second direction perpendicular to the arrangement direction of the first direction, wherein each of the plurality of joint blocks constituting the first block row has a large-diameter flow path for forming a single line, and each of the plurality of joint blocks constituting the second block row having small-diameter flow paths has a smaller diameter than the large-diameter flow path, for forming a first line and a second line, the fluid control device further comprising a manifold extending in the second direction and having a common flow path connected to the single line and to the first and second lines.

10. The fluid control device according to claim 9, wherein the manifold has a port for the large-diameter flow path and a port for the small-diameter flow path formed so as to communicate with the common flow path.

11. The fluid control device according to claim 9, wherein the manifold has ports for the large diameter flow paths formed at equal intervals, one port for the large diameter flow path is connected to the single line of the first block row via a fluid device, and another port is connected to the first line and the second line of the second block row via a valve device.

12. The fluid control device according to claim 11, wherein the valve device has two valve elements and a valve body common for the two valve elements, the valve body has first to fifth ports on a bottom surface, the first port is connected to the port for the large diameter flow path of the manifold, and the second to fifth ports are respectively connected to the first line or the second line constituted by the small diameter flow paths of adjacent joint blocks of the second block row.

13. The fluid control device according to claim 12, wherein the valve body of valve device is air-tightly or liquid-tightly fastened to each of the adjacent joint blocks by two bolts, and air-tightly or liquid-tightly fastened to the manifold by two bolts, and the diameters of the four bolts fastening the valve body to the adjacent joint blocks differ from the diameters of the two bolts fastening the valve body to the manifold.

* * * * *